United States Patent
Li et al.

(10) Patent No.: US 10,290,828 B2
(45) Date of Patent: May 14, 2019

(54) ENCAPSULATION STRUCTURE AND ENCAPSULATION METHOD, AND OLED APPARATUS

(71) Applicants: BOE Technology Group Co., Ltd., Beijing (CN); Hefei BOE Optoelectronics Technology Co., Ltd., Hefei (CN)

(72) Inventors: Yajun Li, Beijing (CN); Jun Zhang, Beijing (CN); Zhihai Zhang, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/321,218

(22) PCT Filed: Apr. 7, 2016

(86) PCT No.: PCT/CN2016/078728
§ 371 (c)(1),
(2) Date: Dec. 22, 2016

(87) PCT Pub. No.: WO2016/197683
PCT Pub. Date: Dec. 15, 2016

(65) Prior Publication Data
US 2017/0207413 A1    Jul. 20, 2017

(30) Foreign Application Priority Data

Jun. 12, 2015 (CN) .......................... 2015 1 0334900

(51) Int. Cl.
*H01L 21/00* (2006.01)
*H01L 23/24* (2006.01)
*H01L 51/52* (2006.01)

(52) U.S. Cl.
CPC ...... *H01L 51/5246* (2013.01); *H01L 51/5253* (2013.01); *H01L 51/5259* (2013.01)

(58) Field of Classification Search
CPC .......................... H01L 23/315; H01L 51/5246
(Continued)

(56) References Cited

U.S. PATENT DOCUMENTS

| 6,262,531 B1 * | 7/2001 | Inoguchi | ................ | H05B 33/04 |
| | | | | 313/500 |
| 7,902,305 B2 * | 3/2011 | Kong | .................... | C08G 65/18 |
| | | | | 524/612 |

(Continued)

FOREIGN PATENT DOCUMENTS

| CN | 101335291 A | 12/2008 |
| CN | 102823017 A | 12/2012 |

(Continued)

OTHER PUBLICATIONS

Aug. 14, 2017—(CN) Third Office Action Appn 201510334900.4 with English Tran.

(Continued)

*Primary Examiner* — Calvin Lee
(74) *Attorney, Agent, or Firm* — Banner & Witcoff, Ltd.

(57) ABSTRACT

A package structure, a packaging method and an organic light-emitting diode (OLED) device are provided. The package structure includes a first substrate and a second substrate which are arranged opposite to each other, and a sealant portion which is disposed between the first substrate and the second substrate, a first enclosed cavity being encircled by the first substrate, the second substrate and the sealant portion; a structure to be packaged being disposed in the first enclosed cavity; and a second enclosed cavity being disposed in the sealant portion and filled with hydrophobic liquid.

17 Claims, 4 Drawing Sheets

(58) Field of Classification Search
USPC ............... 438/319, 411, 422, 619, 112, 124; 257/374, 522, 687, 731
See application file for complete search history.

(56) References Cited

U.S. PATENT DOCUMENTS

| | | | |
|---|---|---|---|
| 8,045,835 B2* | 10/2011 | Palmateer | B81C 1/00285 |
| | | | 359/247 |
| 8,247,879 B2* | 8/2012 | Chen | B81B 3/0005 |
| | | | 257/415 |
| 2003/0066311 A1 | 4/2003 | Li et al. | |
| 2007/0172971 A1 | 7/2007 | Boroson | |
| 2014/0042607 A1* | 2/2014 | Knickerbocker | H01L 25/0657 |
| | | | 257/685 |

FOREIGN PATENT DOCUMENTS

| | | |
|---|---|---|
| CN | 103346268 A | 10/2013 |
| CN | 103456892 A | 12/2013 |
| CN | 103500755 A | 1/2014 |
| CN | 103500799 A | 1/2014 |
| CN | 104124390 A | 10/2014 |
| CN | 105185922 A | 12/2015 |

OTHER PUBLICATIONS

Mar. 22, 2017—(CN) Second Office Action Appn 201510334900.4 with English Tran.
Jul. 14, 2016—(WO) International Search Report and Written Opinion Appn PCT/CN2016/078728 with English Tran.
Oct. 9, 2016—(CN) First Office Action Appn 201510334900.4 with English Tran.

* cited by examiner

ENCAPSULATION STRUCTURE AND ENCAPSULATION METHOD, AND OLED APPARATUS

The application is a U.S. National Phase Entry of International Application No. PCT/CN2016/078728 filed on Apr. 7, 2016, designating the United States of America and claiming priority to Chinese Patent Application No. 201510334900.4, filed Jun. 12, 2015. The present application claims priority to and the benefit of the above-identified applications and the above-identified applications are incorporated by reference herein in their entirety.

TECHNICAL FIELD

The present invention relates to a package structure, a packaging method and an organic light-emitting diode (OLED) device.

BACKGROUND

As OLEDs have the advantages of simple structure, rapid response speed, low power consumption, self-luminescence and the like, a display device manufactured by adoption of the OLEDs has superior display performance and wide application prospect.

In general, a structure to be packaged in an OLED device includes structures such as an anode, an electron transport layer (ETL), an organic emission layer (EML), a hole transport layer (HTL) and a cathode. When driven by certain voltage, electrons and holes are respectively injected into the ETL and the HTL from the cathode and the anode, are migrated to the EML, and meet in the EML to form excitons, and subsequently luminescent molecules are excited to emit visible light after radiation relaxation. Thus, the number of the electrons and the holes migrated to the EML determines the luminous mass of the OLED device.

In order to ensure the number of the electrons and the holes, the work function of the anode and the cathode is usually required to be the lower the better. For instance, relatively active metals such as aluminum, magnesium and calcium are adopted to manufacture the anode and the cathode. But if the OLED device has poor package effect, moisture and oxygen in the air may run through and enter an OLED package structure. As the metals such as aluminum, magnesium and calcium in the OLED main structure are relatively active and tend to react with moisture and oxygen entering the OLED, the number of the electrons and the holes can be reduced, and hence the luminescent property of the OLED device can be affected and the service life of the OLED device can be reduced. Meanwhile, moisture and oxygen will also open unsaturated bonds of polymer, so that organic materials for forming the organic EML can be subjected to accelerated aging, and hence the luminescent property of the OLED device can be further affected and the service life of the OLED device can be further reduced. Thus, the cost of the OLED can be high, so the commercial demands cannot be satisfied.

SUMMARY

An embodiment of the disclosure provides a package structure, comprising: a first substrate and a second substrate arranged opposite to each other; and a sealant portion disposed between the first substrate and the second substrate, a first enclosed cavity being encircled by the first substrate, the second substrate and the sealant portion; a structure to be packaged is disposed in the first enclosed cavity; and a second enclosed cavity is disposed in the sealant portion and filled with hydrophobic liquid.

Another embodiment of the disclosure provides a packaging method, comprising: forming a first sealant portion and a second sealant portion on a first substrate provided with a structure to be packaged, the first sealant portion being annularly disposed on the periphery of the structure to be packaged; the second sealant portion being annularly disposed on the periphery of the first sealant portion; a gap being formed between the first sealant portion and the second sealant portion; injecting hydrophobic liquid into the gap; and bonding a second substrate on the first substrate provided with the first sealant portion and the second sealant portion.

Another embodiment of the disclosure provides an organic light-emitting diode (OLED) device, comprising the package structure as mentioned above, wherein the structure to be packaged is an OLED structure.

Another embodiment of the disclosure provides an organic light-emitting diode (OLED) device, comprising: a first substrate and a second substrate arranged opposite to each other; a sealant portion disposed between the first substrate and the second substrate, a first enclosed cavity being encircled by the first substrate, the second substrate and the sealant portion; an OLED structure is disposed in the first enclosed cavity, wherein the first enclosed cavity is filled with hydrophobic liquid.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Figure 1:
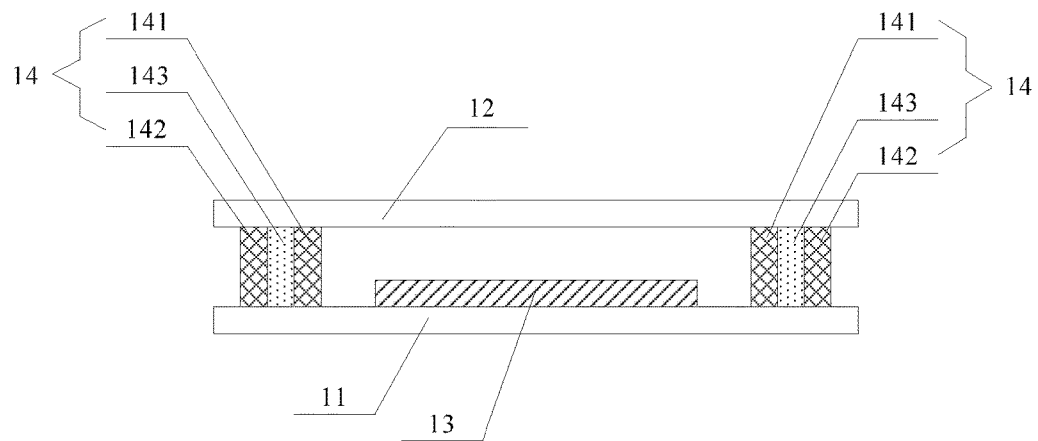
FIG. 1 is a schematic diagram of a package structure provided by an embodiment of the present disclosure.

The embodiment of the present disclosure provides a package structure. As illustrated in FIG. 1, the package structure comprises: a first substrate 11 and a second substrate 12 arranged opposite to each other; and a sealant portion 14 disposed between the first substrate 11 and the second substrate 12, in which a first enclosed cavity is encircled by the first substrate 11, the second substrate 12 and the sealant portion 14; a structure to be packaged 13 is disposed in the first enclosed cavity; and a second enclosed cavity is disposed in the sealant portion 14 and filled with hydrophobic liquid 143.

As illustrated in FIG. 1, the second enclosed cavity is disposed in the sealant portion 14 and filled with the hydrophobic liquid 143. The hydrophobic liquid 143 has hydrophobicity and can prevent external moisture and oxygen from entering the structure to be packaged 13 and avoid moisture and oxygen from affecting the performance of the structure to be packaged 13. The material of the hydrophobic liquid 143 is not limited in the embodiment of the present disclosure. For instance, silicone oil with stable properties may be adopted as the hydrophobic liquid.

The shape of the second enclosed cavity may be various, and for instance, may be rectangular, cylindrical, elliptic and the like. The shape as illustrated in FIG. 1 is only one of various cases. The shape is not limited in the embodiment of the present disclosure.

In the package structure provided by the embodiment of the present disclosure, as the second enclosed cavity of the sealant portion is filled with the hydrophobic liquid with hydrophobicity, moisture and oxygen cannot run through the sealant portion and entre the structure to be packaged. Thus, the influence of moisture and oxygen on the structure to be packaged can be reduced, and hence the performance of the structure to be packaged can be improved and the service life of the structure to be packaged can be prolonged.

Figure 2:
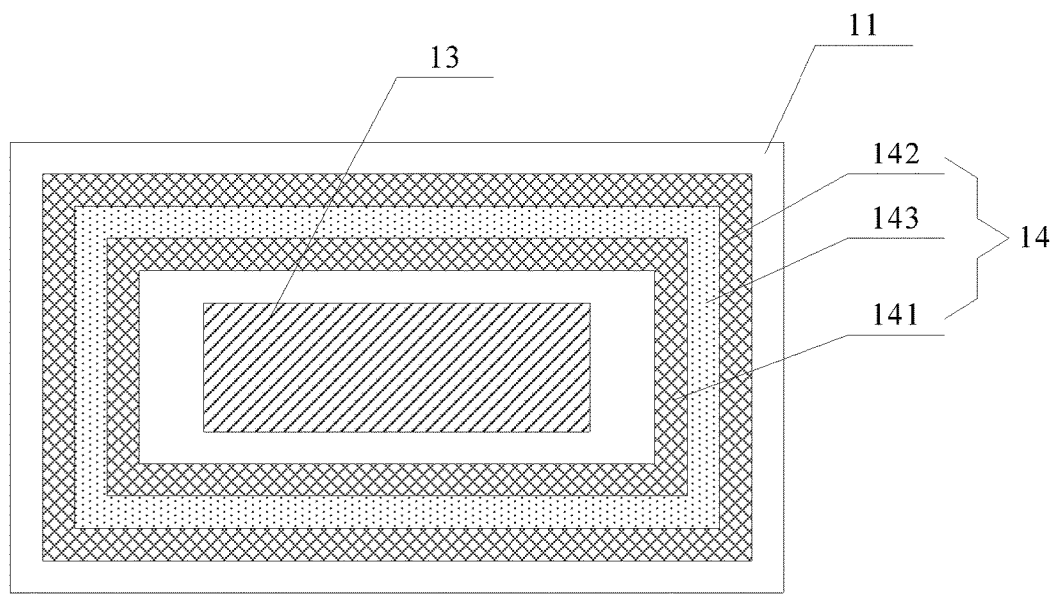
FIG. 2 is a schematic top view of the package structure provided by an embodiment of the present disclosure.

Moreover, as illustrated in FIGS. 1 and 2, the sealant portion 14 includes: a first sealant portion 141, in which the first sealant portion 141 is annular, and a first enclosed cavity is encircled by the first sealant portion 141, the first substrate 11 and the second substrate 12; and a second sealant portion 142, in which the second sealant portion 142 is annularly disposed on the periphery of the first sealant portion 141, and a second enclosed cavity is encircled by the first sealant portion 141, the second sealant portion 142, the first substrate 11 and the second substrate 12.

For instance, as illustrated in FIGS. 1 and 2, the second enclosed cavity is annular (the planar structure in FIG. 2), and the first sealant portion, the second enclosed cavity and the second sealant portion have a same size in the direction of the first substrate and the second substrate. Thus, the hydrophobic liquid can connect the first substrate 11 and the second substrate 12 and hence better prevent moisture and oxygen from entering the first enclosed cavity.

As illustrated in FIGS. 1 and 2, the second enclosed cavity is encircled by the first sealant portion 141, the second sealant portion 142, the first substrate 11 and the second substrate 12 and filled with the hydrophobic liquid 143, so the influence of moisture and oxygen from the sealant portion 14 on the structure to be packaged 13 can be maximally avoided. Thus, the performance of the structure to be packaged 13 can be further guaranteed and the service life of the structure to be packaged 13 can be prolonged.

Figure 3:
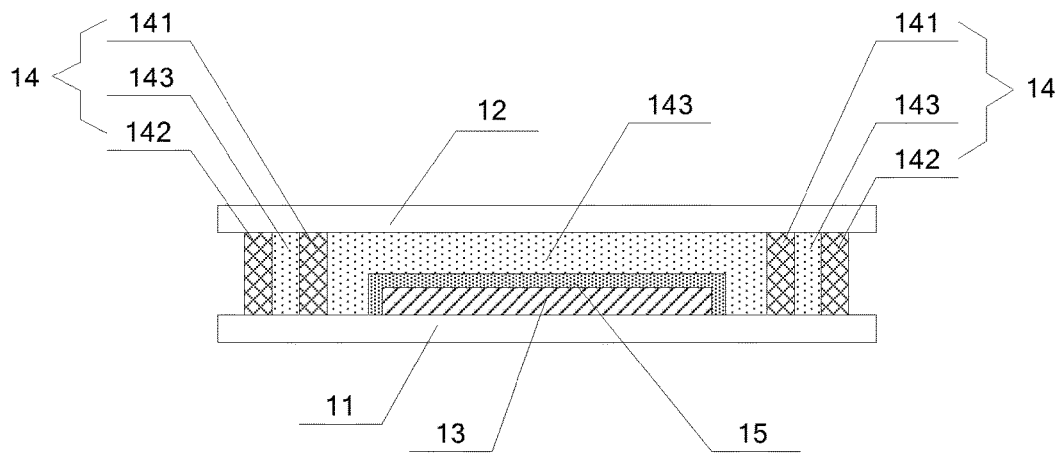
FIG. 3 is a schematic diagram of a package structure provided by another embodiment of the present disclosure.

Moreover, as illustrated in FIG. 3, the package structure further includes: a package film 15 disposed in the first enclosed cavity, in which the package film 15 covers the structure to be packaged 13; and the remaining area of the first enclosed cavity is filled with the hydrophobic liquid 143.

The package film 15 is a film for packaging the structure to be packaged 13. The material of the package film 15 may be various. For instance, the package film 15 may be made from silicon oxide, silicon nitride, etc. The material is not limited in the embodiment of the present disclosure. Although the package film can also prevent external moisture and oxygen from affecting the structure to be packaged in the prior art, the blocking effect is poor and the manufacturing process is complex. As illustrated in FIG. 3, the hydrophobic liquid 143 is filled between the package film 15 and the second substrate 12, so moisture and oxygen in the direction of the second substrate 12 can be further blocked. Thus, the performance of the structure to be packaged 13 can be improved; the service life of the structure to be packaged 13 can be prolonged; and the manufacturing process can be simple.

As silicone oil has stable properties, is insoluble in water, and is not soluble with the first substrate, the second substrate and the sealant portion, the silicone oil may be adopted as the hydrophobic liquid. Simethicone is non-toxic and tasteless, is a colorless and transparent new synthetic polymer material, has special smoothness, softness and hydrophobicity, and has physiological inertia, good chemical stability, excellent electrical insulation and high temperature resistance. Simethicone can be used for a long term under the temperature of −50° C. to +200° C. and has low viscosity-temperature coefficient, high compressibility, low surface tension, good hydrophobicity and moisture resistance, and low specific heat capacity and thermal conductivity. Therefore, the silicone oil is, for instance, simethicone.

Moreover, the viscosity of the hydrophobic liquid is ranged from 5 cps to $8 \times 10^6$ cps. Due to the wide viscosity range, the hydrophobic liquid may be liquid which can flow easily and may also be thick semisolid, so the range of the hydrophobic liquid can be widened.

As epoxy resin or UV curing adhesive has good bonding strength and dielectric property and is stable in alkali and most solvents, the first sealant portion and the second sealant portion, for instance, may adopt the epoxy resin or the UV curing adhesive. However, the material of the first sealant portion and the second sealant portion is not limited in the embodiment of the present disclosure. The first sealant portion and the second sealant portion may also adopt different materials.

The package structure provided by the embodiment of the present disclosure comprises: a first substrate and a second substrate arranged opposite to each other; and a sealant portion disposed between the first substrate and the second substrate, in which a first enclosed cavity is encircled by the first substrate, the second substrate and the sealant portion; a structure to be packaged is disposed in the first enclosed cavity; and a second enclosed cavity is disposed in the sealant portion and filled with hydrophobic liquid. In the package structure provided by the embodiment of the present disclosure, as the second enclosed cavity of the sealant portion is filled with the hydrophobic liquid with hydrophobicity, moisture and oxygen cannot run through the sealant portion and enter the structure to be packaged. Thus, the influence of moisture and oxygen on the structure to be packaged can be reduced, and hence the performance of the structure to be packaged can be improved and the service life of the structure to be packaged can be prolonged.

Figure 4:
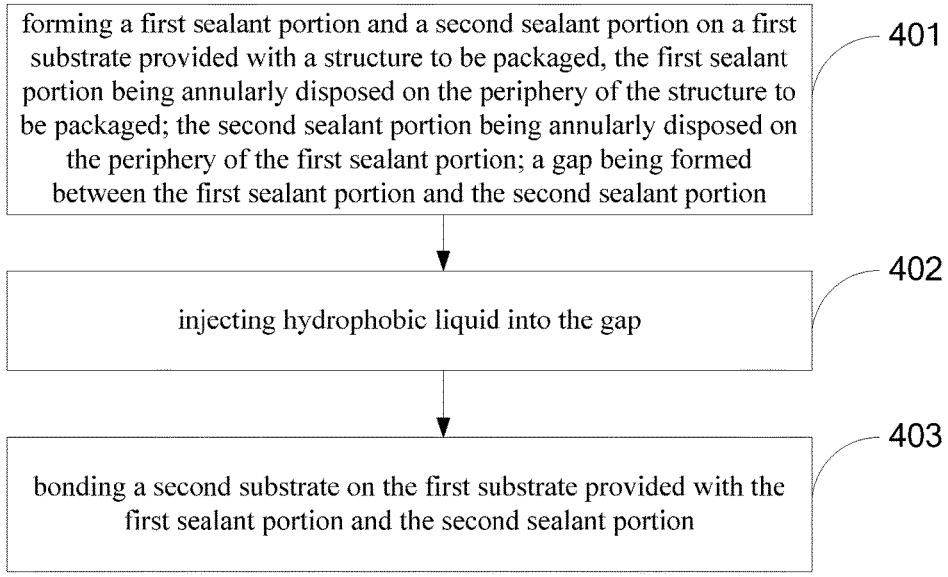
FIG. 4 is a flowchart of a packaging method provided by one embodiment of the present disclosure.

Still another embodiment of the present disclosure provides a packaging method. As illustrated in FIG. 4, the packaging method comprises the steps S401 to S403. The packaging method is only one example of the present disclosure. The packaging method provided by the embodiment of the present disclosure is not limited to the sequence indicated by the step numbers. In addition, other steps may also be added before or after the steps.

S401: forming a first sealant portion and a second sealant portion on a first substrate provided with a structure to be packaged, in which the first sealant portion is annularly disposed on the periphery of the structure to be packaged; the second sealant portion is annularly disposed on the periphery of the first sealant portion; and a gap is formed between the first sealant portion and the second sealant portion.

The first substrate 11 may be a glass substrate, a metal substrate or a polymer substrate. No limitation will be given here in the embodiment of the present disclosure.

As illustrated in FIG. 1, a first sealant portion 141 and a second sealant portion 142 may be simultaneously formed on the periphery of the structure to be packaged 13, and a gap is formed between the first sealant portion 141 and the second sealant portion 142. The first sealant portion 141 and the second sealant portion 142 are generally epoxy resin or UV curing adhesive.

S402: injecting hydrophobic liquid into the gap.

As illustrated in FIG. 1, after the first sealant portion 141 and the second sealant portion 142 are formed, hydrophobic liquid 143 with hydrophobicity may be injected into the gap disposed between the first sealant portion 141 and the second sealant portion 142. The hydrophobic liquid 143 may prevent moisture and oxygen coming from the direction of the first sealant portion 141 and the second sealant portion 142 from affecting a structure to be packaged 13.

S403: bonding a second substrate on the first substrate provided with the first sealant portion and the second sealant portion.

The hydrophobic liquid is not soluble with the first substrate, the second substrate, the first sealant portion and the second sealant portion.

After the hydrophobic liquid is injected into the gap disposed between the first sealant portion and the second sealant portion, the second substrate is bonded and the structure to be packaged is packaged. The second substrate may be a glass substrate, a metal substrate or a polymer substrate. No limitation will be given here in the embodiment of the present disclosure.

In the packaging method provided by the embodiment of the present disclosure, as the second enclosed cavity of the sealant portion is filled with the hydrophobic liquid with hydrophobicity, moisture and oxygen cannot run through the sealant portion and enter the structure to be packaged. Thus, the influence of moisture and oxygen on the structure to be packaged can be reduced, and hence the performance of the structure to be packaged can be improved and the service life of the structure to be packaged can be prolonged.

Figure 5:
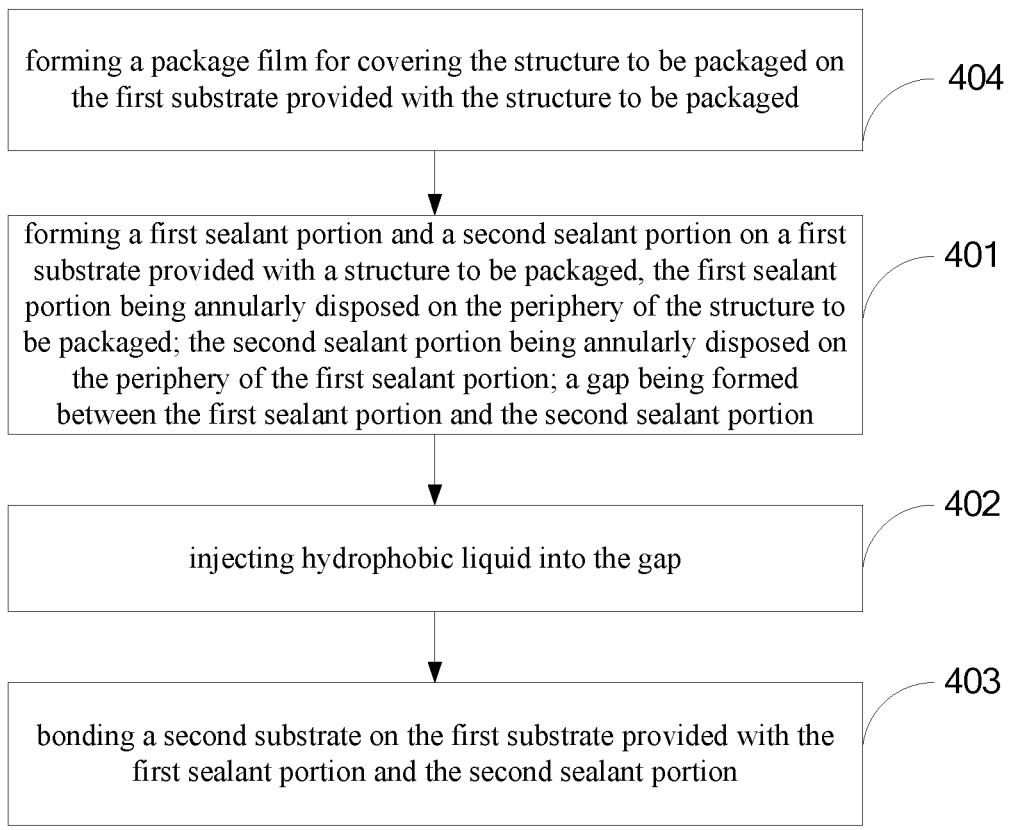
FIG. 5 is a flowchart of a packaging method provided by another embodiment of the present disclosure.

Moreover, as illustrated in FIG. 5, before the step of forming the first sealant portion and the second sealant portion on the first substrate provided with the structure to be packaged, the packaging method further comprises:

S404: forming a package film for covering the structure to be packaged on the first substrate provided with the structure to be packaged.

The package film is a film for packaging the structure to be packaged. The material of the package film may be various. For instance, the package film may be silicon oxide, silicon nitride, etc. No limitation will be given here in the embodiment of the present disclosure.

Figure 6:
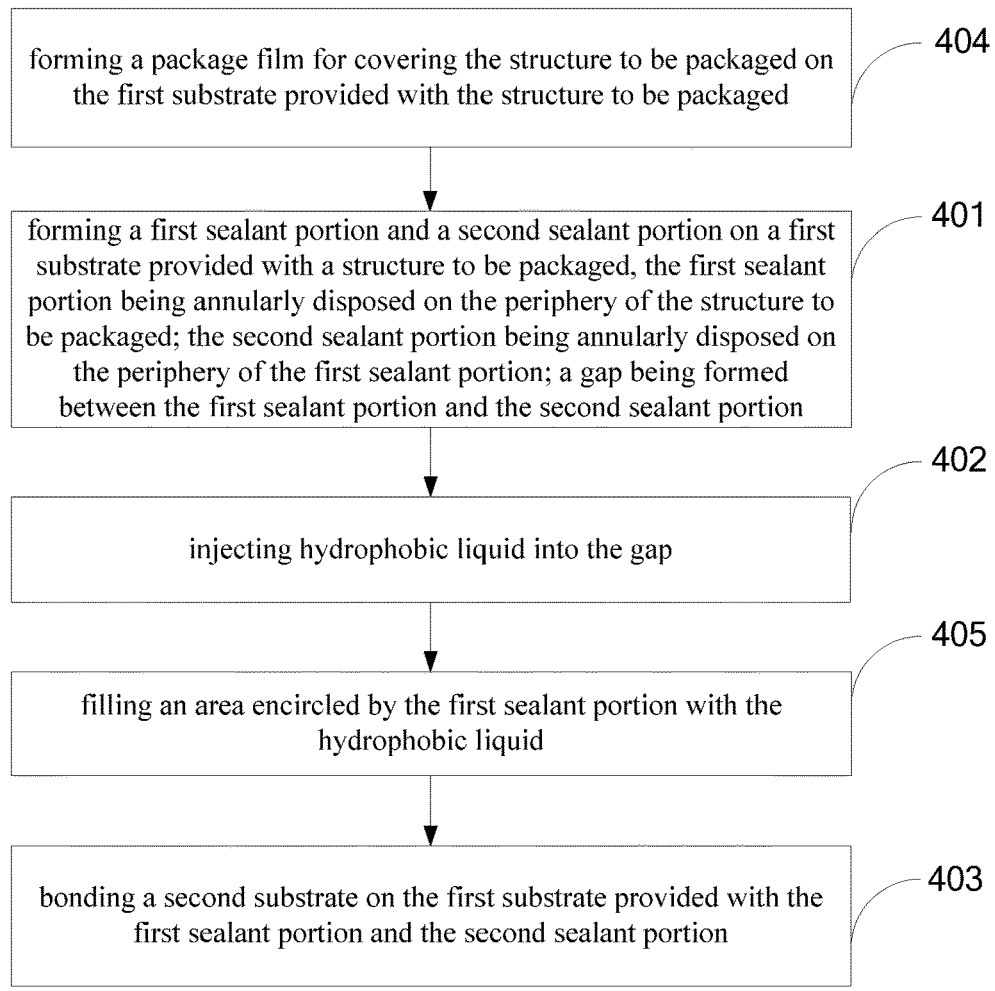
FIG. 6 is a flowchart of a packaging method provided by still another embodiment of the present disclosure.

Moreover, as illustrated in FIG. 6, after the step of forming the first sealant portion and the second sealant portion and before the step of bonding the second substrate on the first substrate provided with the first sealant portion and the second sealant portion, the packaging method further comprises:

S405: filling an area encircled by the first sealant portion with hydrophobic liquid.

As the area encircled by the first sealant portion is filled with the hydrophobic liquid, the influence of moisture and oxygen from the direction of the second substrate on the structure to be packaged can be avoided.

It should be noted that: in the actual manufacturing process, S402 may be executed at first and S405 may be executed subsequently; or S405 may be executed at first and S402 may be executed subsequently; or S402 and S405 may also be simultaneously executed. No limitation will be given here in the embodiment of the present disclosure. The case as shown in FIG. 6 is only one of the cases.

The embodiment of the present disclosure provides a packaging method. The packaging method comprises: forming a first sealant portion and a second sealant portion on a first substrate provided with a structure to be packaged, in which the first sealant portion is annularly disposed on the periphery of the structure to be packaged; the second sealant portion is annularly disposed on the periphery of the first sealant portion; and a gap is formed between the first sealant portion and the second sealant portion and filled with hydrophobic liquid; and bonding a second substrate on the first substrate provided with the first sealant portion and the second sealant portion. In the packaging method provided by the embodiment of the present disclosure, as the second enclosed cavity of the sealant portion is filled with the hydrophobic liquid with hydrophobicity, moisture and oxygen cannot run through the sealant portion and entre the structure to be packaged. Thus, the influence of moisture and oxygen on the structure to be packaged can be reduced, and hence the performance of the structure to be packaged can be improved and the service life of the structure to be packaged can be prolonged.

Still another embodiment of the present disclosure provides an OLED device, which comprises any foregoing package structure, wherein the structure to be packaged is an OLED main structure. In the package structure provided by the embodiment of the present disclosure, as the second enclosed cavity of the sealant portion is filled with the hydrophobic liquid with hydrophobicity, moisture and oxygen cannot run through the sealant portion and entre the structure to be packaged. Thus, the influence of moisture and oxygen on the structure to be packaged can be reduced, and hence the performance of the structure to be packaged can be improved and the service life of the structure to be packaged can be prolonged.

Moreover, the OLED device further comprises a package film disposed in the first enclosed cavity. The package film covers the OLED main structure. The remaining area of the first enclosed cavity is filled with hydrophobic liquid.

As illustrated in FIG. 1, the first enclosed cavity is encircled by a first substrate 11, a second substrate 12 and a sealant portion 14. The sealant portion 14 may be formed by a first sealant portion 141, a second sealant portion 142 and hydrophobic liquid 143 filled between the first sealant portion 141 and the second sealant portion 142.

For instance, the package film may be silicon oxide, silicon nitride, etc. No limitation will be given here in the embodiment of the present disclosure. Although in the prior art, the package film can also prevent external moisture and oxygen from affecting the OLED main structure, the blocking effect is poor and the manufacturing process is complex. As illustrated in FIG. 3, as the hydrophobic liquid 143 is filled between the package film 15 and the second substrate 12, moisture and oxygen from the direction of the second substrate 12 can be further blocked. Thus, the performance of the OLED main structure 13 can be improved; the service life of the OLED main structure 13 can be prolonged; and the manufacturing process is simple.

As for OLED flexible display, the substrate is generally made from high molecular polymer, ultra-thin glass or foil. When the high molecular polymer is adopted as the substrate, although the high molecular polymer has good flexibility, low mass and impact resistance, the moisture and oxygen barrier property is poor, so the package requirement cannot be satisfied. When the ultra-thin glass is taken as the substrate, although the ultra-thin glass has good visible light permeability, has good moisture and oxygen barrier property and good chemical and thermal stability, after the ultra-thin glass satisfies the thickness requirement, the ultra-thin glass can have poor flexibility and is also fragile, and very small stress from the outside will result in cracks in the ultra-thin glass. When the foil is adopted as the substrate, the substrate has high resistant temperature; the moisture and oxygen barrier property can basically reach the production requirement of the OLED device; and the mechanical strength is also high when the thickness of the foil is less than 0.1 mm. But as metal is opaque, when the foil is taken as the substrate, the OLED device can only be manufactured into a top-emission device.

Figure 7:
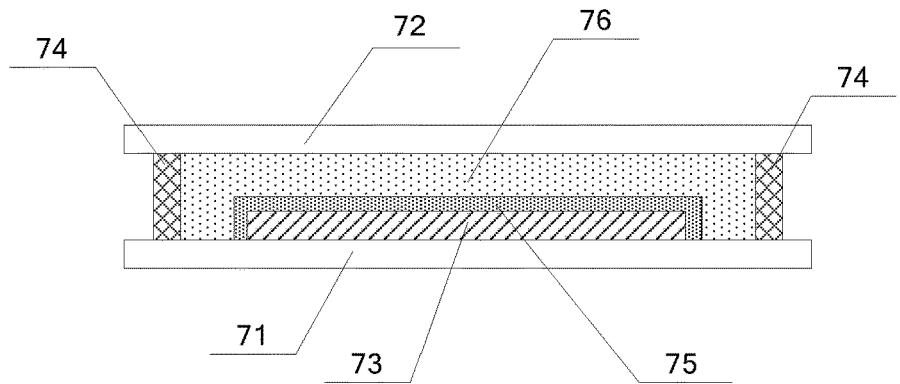
FIG. 7 is a schematic structural view of an OLED device provided by the embodiment of the present disclosure.

FIG. 7 illustrates an OLED top-emission device, wherein a first substrate 71 is a flexible metal substrate made from foil and a second substrate 72 is a flexible polymer substrate made from high molecular polymer materials. As the high molecular polymer has poor moisture and oxygen barrier property, more moisture and oxygen will enter an OLED main structure from the direction of the second substrate 72, so the performance of the OLED main structure 73 can be affected. Therefore, when the OLED main structure 73 is packaged, a cavity encircled by a package film 75, a sealant portion 74 and a second substrate 72 is filled with hydrophobic liquid 76 with hydrophobicity, so not only moisture and oxygen from the direction of the sealant portion can be blocked but also moisture and oxygen from the direction of the second substrate 72 can be blocked, and hence moisture and oxygen cannot enter the OLED main structure 73. Thus, the influence of moisture and oxygen on the OLED main structure 73 can be reduced, and hence the performance of the OLED main structure 73 can be improved and the service life of the OLED main structure 73 can be prolonged.

In the embodiment of the present disclosure, the hydrophobic liquid may be filled into any of the first enclosed cavity and the second enclosed cavity and may also be filled into both the first enclosed cavity and the second enclosed cavity. Or the second enclosed cavity may also be not arranged and the hydrophobic liquid is only filled into the first enclosed cavity.

For instance, the OLED device provided by the present disclosure may be an OLED display device or an OLED lighting device. No limitation will be given here in the embodiment of the present disclosure.

The foregoing is only the preferred embodiments of the present invention and not intended to limit the scope of protection of the present invention. The scope of protection of the present invention should be defined by the appended claims.

The application claims priority to the Chinese patent application No. 201510334900.4, filed Jun. 12, 2015, the disclosure of which is incorporated herein by reference as part of the application.

The invention claimed is:

1. A packaging method, comprising:
providing a first substrate with a structure to be packaged;
forming a package film covering the structure to be packaged;
forming a first sealant portion and a second sealant portion on the first substrate provided with the structure to be packaged, the first sealant portion being annularly disposed on a periphery of the structure to be packaged, the second sealant portion being annularly disposed on a periphery of the first sealant portion, a gap being formed between the first sealant portion and the second sealant portion;
injecting hydrophobic liquid into the gap; and
bonding a second substrate on the first substrate provided with the first sealant portion and the second sealant portion, wherein the hydrophobic liquid is further filled between the package film and the second substrate.

2. The packaging method according to claim 1, wherein after forming the first sealant portion and the second sealant portion, and before bonding the second substrate on the first substrate provided with the first sealant portion and the second sealant portion, the packaging method further comprises:
filling an area encircled by the first sealant portion with the hydrophobic liquid.

3. An organic light-emitting diode (OLED) device, comprising:
a first substrate and a second substrate, arranged opposite to each other;
a sealant portion disposed between the first substrate and the second substrate, a first enclosed cavity being encircled by the first substrate, the second substrate, and the sealant portion, wherein an OLED structure is disposed in the first enclosed cavity, and wherein the first enclosed cavity is filled with a hydrophobic liquid; and
a package film, disposed in the first enclosed cavity and covering the OLED structure, wherein the hydrophobic liquid is filled between the package film and the second substrate.

4. The OLED device according to claim 3, wherein the hydrophobic liquid is silicone oil.

5. The OLED device according to claim 3, wherein a second enclosed cavity is disposed in the sealant portion and filled with the hydrophobic liquid.

6. The OLED device according to claim 5, wherein the sealant portion includes:
a first sealant portion, the first sealant portion being annular, wherein the first enclosed cavity is encircled by the first sealant portion, the first substrate, and the second substrate; and
a second sealant portion, the second sealant portion being annularly disposed on a periphery of the first sealant portion, wherein the second enclosed cavity is encircled by the first sealant portion, the second sealant portion, the first substrate, and the second substrate.

7. A package structure, comprising:
a first substrate and a second substrate, arranged opposite to each other;
a sealant portion disposed between the first substrate and the second substrate, wherein a first enclosed cavity is encircled by the first substrate, the second substrate, and the sealant portion, wherein a structure to be packaged is disposed in the first enclosed cavity, and wherein a second enclosed cavity is disposed in the sealant portion and filled with a hydrophobic liquid; and
a package film, disposed in the first enclosed cavity and covering the structure to be packaged, and the hydrophobic liquid is further filled between the package film and the second substrate.

8. The package structure according to claim 7, wherein a remaining area of the first enclosed cavity is filled with the hydrophobic liquid.

9. The package structure according to claim 7, wherein a viscosity of the hydrophobic liquid is ranged from 5 cps to $8 \times 10^6$ cps.

10. The package structure according to claim 7, wherein the hydrophobic liquid is silicone oil.

11. The package structure according to claim 10, wherein the silicone oil is simethicone.

12. The package structure according to claim 7, wherein the sealant portion includes:
a first sealant portion, the first sealant portion being annular, wherein the first enclosed cavity is encircled by the first sealant portion, the first substrate, and the second substrate; and
a second sealant portion, the second sealant portion being annularly disposed on a periphery of the first sealant portion, wherein the second enclosed cavity is encircled by the first sealant portion, the second sealant portion, the first substrate, and the second substrate.

13. The package structure according to claim 12, wherein both a material of the first sealant portion and a material of the second sealant portion are epoxy resin or ultraviolet (UV) curing adhesive.

14. The package structure according to claim 12, wherein the second enclosed cavity is annular; and the first sealant portion, the second enclosed cavity, and the second sealant portion have a same size in a direction of the first substrate to the second substrate.

15. An organic light-emitting diode (OLED) device, comprising the package structure according to claim 7, wherein the structure to be packaged is an OLED structure.

16. The OLED device according to claim 15, wherein the sealant portion includes:
a first sealant portion, the first sealant portion being annular, wherein the first enclosed cavity is encircled by the first sealant portion, the first substrate, and the second substrate; and
a second sealant portion, the second sealant portion being annularly disposed on a periphery of the first sealant portion, wherein the second enclosed cavity is encircled by the first sealant portion, the second sealant portion, the first substrate, and the second substrate.

17. The OLED device according to claim 16, wherein the second enclosed cavity is annular; and the first sealant portion, the second enclosed cavity, and the second sealant portion have a same size in a direction of the first substrate to the second substrate.

* * * * *